United States Patent

Maskeny

[19]

[11] Patent Number: 5,990,802
[45] Date of Patent: Nov. 23, 1999

[54] MODULAR LED MESSAGING SIGN PANEL AND DISPLAY SYSTEM

[75] Inventor: Donald David Maskeny, Morriston, Fla.

[73] Assignee: Smartlite Communications, Inc.

[21] Appl. No.: 09/080,687

[22] Filed: May 18, 1998

[51] Int. Cl.[6] .................................................. G08B 5/00
[52] U.S. Cl. ...................... 340/815.45; 345/82; 345/46; 345/903; 345/362; 345/244; 340/815.42
[58] Field of Search ...................... 340/815.45, 815.31, 340/815.42; 345/82, 156, 39, 46, 903, 83, 204, 205; 362/244

[56] References Cited

U.S. PATENT DOCUMENTS

| | | | |
|---|---|---|---|
| 4,383,254 | 5/1983 | Gemmell et al. | 362/244 |
| 4,445,132 | 4/1984 | Ichikawa et al. | 345/82 |
| 4,772,886 | 9/1988 | Hasegawa | 340/815.42 |
| 4,887,074 | 12/1989 | Simon et al. | 345/82 |
| 5,066,947 | 11/1991 | Du Castel | 340/825.82 |
| 5,138,310 | 8/1992 | Hirane et al. | 340/815.45 |
| 5,174,649 | 12/1992 | Alston | 345/156 |
| 5,198,803 | 3/1993 | Shie et al. | 345/82 |
| 5,394,165 | 2/1995 | Sugiura | 345/80 |
| 5,410,328 | 4/1995 | Yoksza et al. | 345/82 |
| 5,414,828 | 5/1995 | Yarkoni et al. | 345/82 |
| 5,418,928 | 5/1995 | Yarkoni et al. | 345/82 |
| 5,450,301 | 9/1995 | Waltz et al. | 345/82 |
| 5,451,979 | 9/1995 | Levac | 340/815.45 |
| 5,684,368 | 11/1997 | Wei et al. | 340/825.5 |
| 5,708,452 | 1/1998 | Takahashi | 340/825.5 |
| 5,717,417 | 2/1998 | Takahashi | 345/82 |
| 5,796,376 | 8/1998 | Banks | 345/82 |

*Primary Examiner*—Edward Lefkowitz
*Assistant Examiner*—Davetta Woods
*Attorney, Agent, or Firm*—Larson & Larson, P.A.; James E. Larson

[57] ABSTRACT

A modular messaging sign panel contains a plurality of LEDs coupled to a plurality of latched drivers. A microcontroller on the panel has a unique serial number permitting the panel to be selectively addressed by a host. The microcontroller receives serial data representing an image frame, selects the data intended for the panel in which it controls and clocks it out to the latched drivers along a single serial data line. Multiple panels can be connected to form a larger display panel system. Each panel has its own uniquely addressed microcontroller. A three wire connection couples the panel or display system to a computer and a power supply. A single jumper wire connects each modular panel together such that the data output from the computer is received by every microcontroller within the system in a parallel configuration. Accordingly, each microcontroller is receiving all the data outputted from the computer but only selects certain data for distribution to the latched drivers coupled to the LEDs on its particular panel based upon an ID match. Power and ground are supplied to a multi-panel system via power and ground rails of a frame structure upon which the panels are mounted.

29 Claims, 7 Drawing Sheets

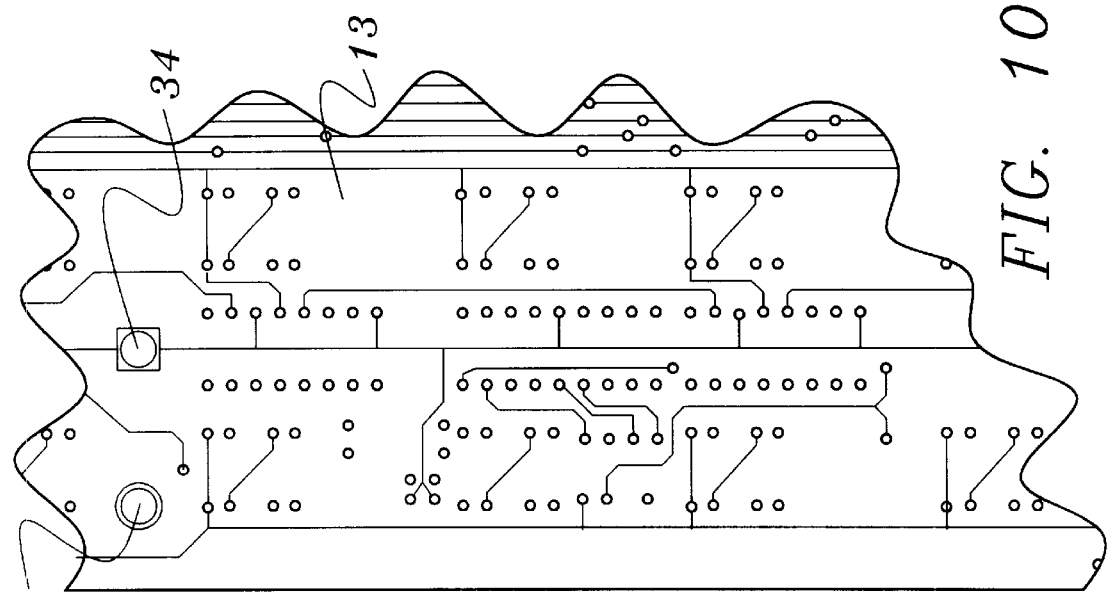
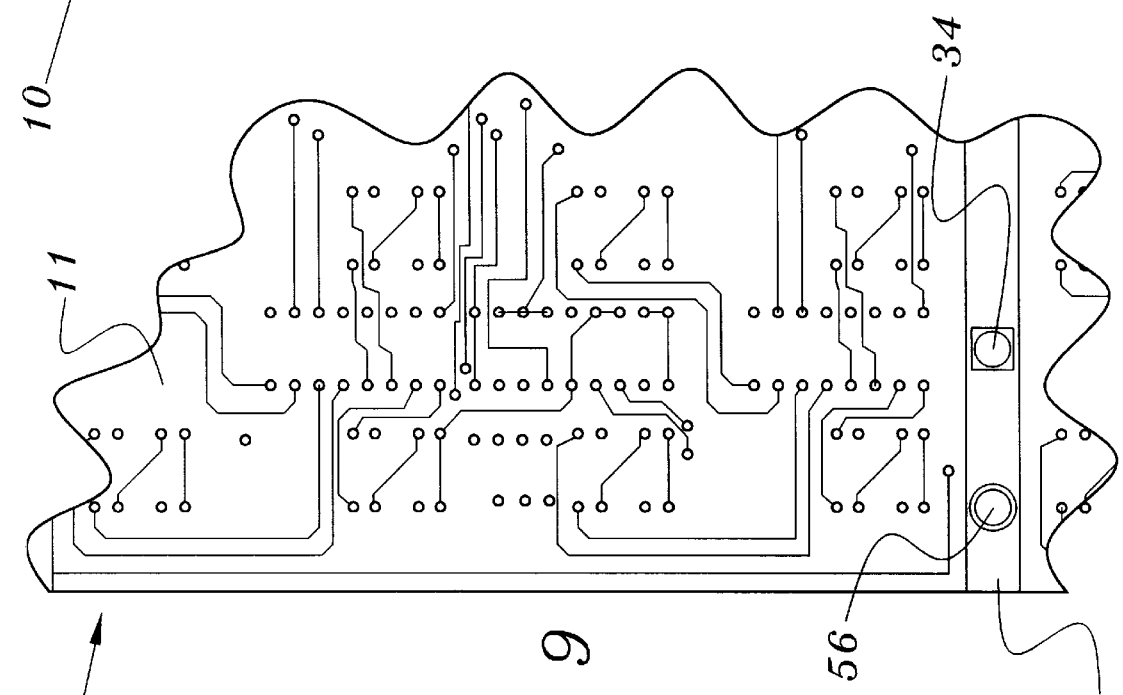

MODULAR LED MESSAGING SIGN PANEL AND DISPLAY SYSTEM

BACKGROUND OF THE INVENTION

1. Field of the Invention

This invention relates to an LED messaging sign panel. More particularly, it relates to a system which permits multiple modular LED messaging sign panels to be attached to create a larger panel display system yet retaining a means for addressing the individual LED sign panels within the display system.

2. Description of Prior Art

LED (light emitting diode) sign panels are known in the prior art. Typically, a display matrix of LEDs is arranged in a row-column array. For instance, in U.S. Pat. No. 4,445,132 to Ichikawa et al., 8×8, 12×12 and 16×16 arrays are shown wherein the first numeral represents the number of rows of LEDs and the second numeral represents the number of columns of LEDs. These rows and columns of LEDs formed a flat panel LED display. Although flat panel displays can be made in order to utilize different light sources (i.e., electroluminescence, plasma, fluorescent tube or incandescent bulbs), LED flat panel displays have become one of the most popular formats to use for displaying information and messages. Reasons for LED popularity include smaller operation voltages and reduced current requirements as compared to other types of light sources.

Unfortunately, most LED display designers discovered that it was difficult to manufacture very large LED display panels. Many of the benefits conferred from the use of LED technology did not outweigh the problems inherent with the construction of large display panels. Therefore, it was proposed that modular panels of smaller arrays be utilized, attachable to one another, to form a single larger display panel.

U.S. Pat. No. 5,450,301 to Waltz et al. proposes the use of modular panels of smaller arrays to form a larger LED display panel. Unfortunately, there is no teaching for individual operator control of each module in the field. The individual modules are merely elements of the larger display. Waltz et al. does not permit an operator to address or control each module individually. Further, such a configuration requires multiple wire connections between each module. This may present problems in troubleshooting the individual panels. Further, there is no teaching for controlling the Waltz et al. device by a computer. Computer control of LED display panels is recognized as a useful feature in the display of messages and other information.

Other designers, recognizing the benefits that computer controlled LED displays would provide, began developing systems which permit computer control. U.S. Pat. No. 4,887,074 to Simon et al. discloses a computer-controlled LED display system which utilizes a multitude of parallel port outputs of a computer to shift data through a multitude of shift registers, including parallel-in-parallel-out (PIPO), parallel-in-serial-out (PISO) and serial-in-parallel-out (SEPO) registers all in an effort to drive a single LED array. Although such a system permits the operator to utilize the benefits of computer to display a graphic file on the display panel, the shifting of data through a plurality of shift registers in the vertical and horizontal directions is inefficient. Such a system is analogous to a multiplexing system which operates by scanning each row of LEDs in the array in a discernable time frame thereby giving the illusion that the picture is being displayed across the entire panel at the same time—much like the technique used in conventional TV picture tube displays. Multiplexing systems have inherent disadvantages; one such disadvantage is the slow refresh display rates due to the required time to scan the entire display panel. None of the prior art systems permit an entire display panel to show a graphic along all of its vertical and horizontal arrays simultaneously while loading the next frame directly behind it within an entire digital domain.

Another inherent problem in the prior art systems relates to brightness control and correction. Because of the large size of many display systems, a drop in the overall brightness of the display panel and varying brightness from module to module within the display panel system can be evident due to the increase in load requirements upon the power supply of a large display system. Brightness control circuits have been implemented along with the circuitry of the LED driving circuits to control and correct brightness. Such can been seen in U.S. Pat. No. 5,451,979 to Levac whereby the expected load is determined during a refresh scan that is about to produce the next image. The number of LEDs to be energized is counted and compared to a duty cycle index table stored in memory. The display refresh duty cycle is then adjusted depending on an expected increase or decrease in the power supply load requirement. Although such a routine permits an unregulated power supply output to be maintained within preselected limits thereby increasing the output to handle peak loads and decreasing the output to handle low loads, such a system does not ensure that a decrease in each light across the entire display panel will not occur. In fact, the Levac system compromises overall panel brightness in favor of uniform brightness from LED to LED.

Due to all of the deficiencies in the prior art, an improved LED display panel system is needed.

SUMMARY OF THE INVENTION

I have invented a novel modular LED sign panel and display panel system. My LED sign panels are generally formed as rectangular shaped circuit boards containing a plurality of parallel modules (or rows) of LEDs. The LEDs are electrically coupled to a plurality of 8-bit serial-input latched drivers in each module. Serial data moves through each latched driver such that the first byte of data to enter the first latched driver ends up being the last byte of data loaded in the last latched driver of each individual sign panel. This permits easy diagnosis of faulty drivers. If LEDs fail to illuminate past a certain latched driver, then a fault must be associated with that particular driver. Further, the configuration of the present invention permits use of a single serial data line through all of the latched drivers of every module on each panel.

Each module on each panel additionally contains a voltage regulator coupled thereto to ensure a constant DC voltage supply. This ensures uniform and non-varying brightness of all of the LEDs as the load requirement upon the power supply rises or falls.

Each modular LED sign panel contains a microcontroller having a unique serial number. For example, if ten modular sign panels where employed to create a single sign panel display system, ten microcontrollers would be employed with each of the ten microcontrollers having a unique addressable serial number. Because of the unique serial numbers, each microcontroller on each panel is able to receive and process serial data intended for the LED sign panel it controls. Data is supplied to the sign panels from a computer through an RS-b 232port of a computer. After the data is received by the microcontroller, it determines whether the data is intended for the panel it controls and then latches the data to the drivers on its particular panel. As the microcontroller receives data which is not intended for the panel it controls, the microcontroller ignores the data, thereby permitting the properly addressed microcontroller to receive and distribute its uniquely addressed data.

The novel means of the present invention of having an onboard microcontroller on each modular sign panel provides many advantages over the prior art. First, it permits each modular panel of a multi-panel display system to be uniquely identified. This allows easy replacement if failure occurs on a particular panel. Secondly, the use of a microcontroller to feed the serial data to a plurality of latched drivers allows an entire graphic to be loaded and held and then "strobed" at one time while loading data of the next image directly therebehind. Multiplexing is completely eliminated in the present invention.

To attach multiple sign panels to create a larger panel display system, a framed structure having a power and ground bus is employed. The individual sign panels are screwed down through plate-through holes formed in the panel, electrically coupling the respective power and ground buses of each modular panel. A single wire jumps from panel to panel from a point on each panel associated with the RXD data line from the computer. Accordingly, the microcontrollers are wired in parallel with respect to the data output of the computer wherein all the microcontrollers are reading all the outputted data, but reacting only to the data specifically addressed to its particular panel.

This novel approach allows a panel display system to be configured such that only three wires are employed: power, ground, and data. This is an improvement over the prior art wherein multiple wires are required to form a panel display system from a plurality of modular panels.

BRIEF DESCRIPTION OF THE DRAWINGS

The invention may be best understood by those having ordinary skill in the art by reference to the following detailed description when considered in conjunction with the accompanying drawings in which:

FIG. 9 is a detailed view of FIG. 2; and FIG. 10 is a detailed view of FIG. 3.

DETAILED DESCRIPTION OF THE INVENTION

Figure 1:
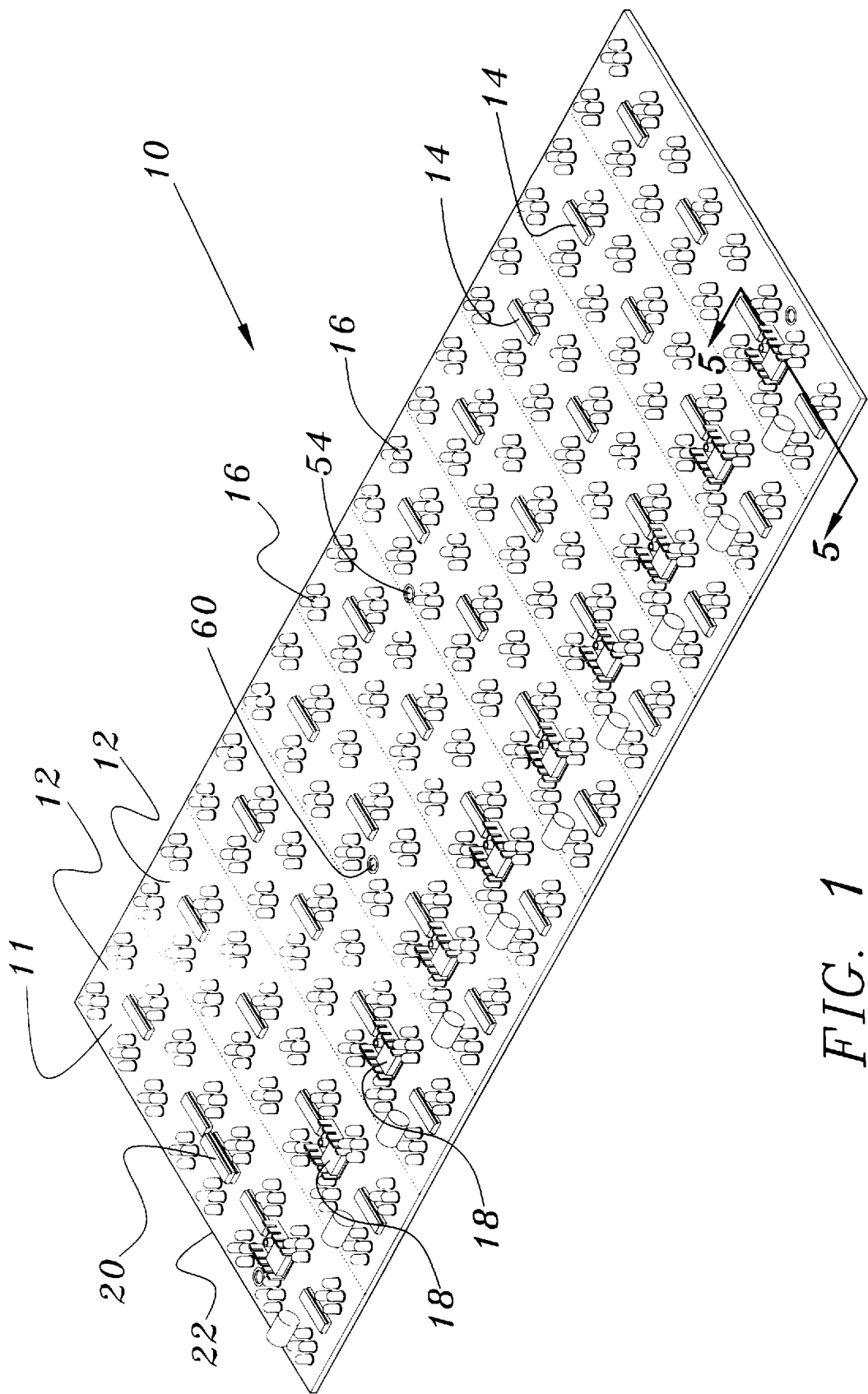
FIG. 1 is a top plan view of a modular LED sign panel, of the present invention, having electrical components coupled thereto.

Throughout the following detailed description, the same reference numerals refer to the same elements in all figures.

Figures 2, 3:
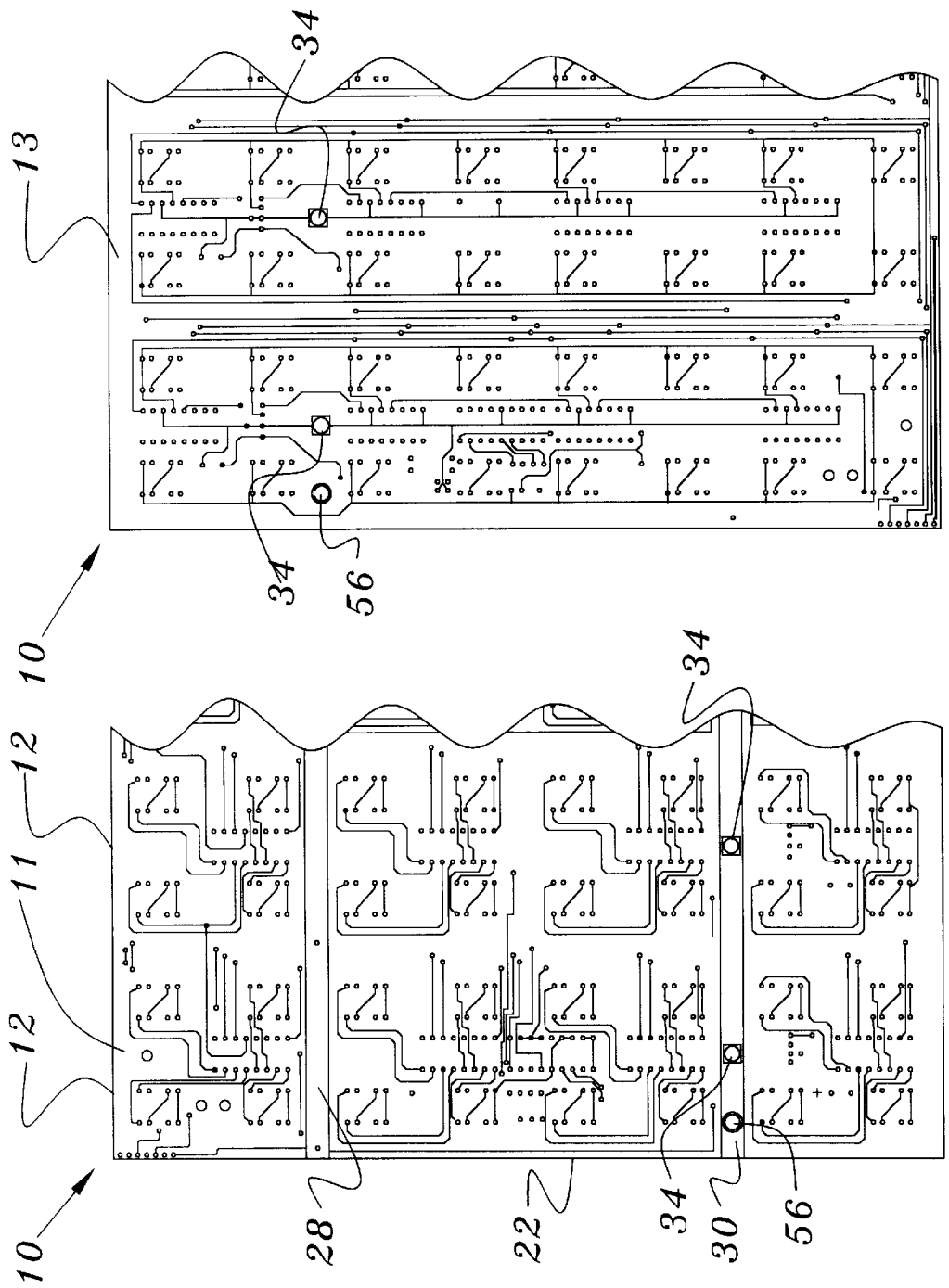
FIG. 2 is a partial top plan view of the modular LED sign panel having no electrical components coupled thereto.
FIG. 3 is a partial bottom plan view of the modular LED sign panel having no electrical components coupled thereto.

Referring to FIG. 1, a modular LED sign panel 10 of the present invention is shown. Panel 10 is constructed from an electrical circuit board having copper circuits traced upon a top side 11 (see FIG. 2) and a bottom side 13 (see FIG. 3). A plurality of plate-through holes (to be discussed in more detail hereinafter) are scattered about panel 10 and permit certain circuits to trace from the top side 11 to the bottom side 13 and vice versa. Panel 10 has a plurality of modules 12 arranged in rows. In the preferred embodiment ten modules are employed. Each module 12 contains a plurality of latched driver ICs 14. In the preferred embodiment four latched driver ICs are employed, although 255 could be employed on a single LED sign panel 10. Electrically coupled to each latched driver 14 is a plurality of LEDs 16. In the preferred embodiment sixteen LEDs are coupled to each latched driver 14. Accordingly, when the preferred number of ten modules is employed with the preferred number of four latched drivers with the preferred number of sixteen LEDs coupled to each latched driver, panel 10 contains 640 LEDs (16 LEDs×4 latched drivers×10 modules=640 LEDs). Each module 12 also has a voltage regulator 18 electrically coupled to the circuit associated with each module. In the preferred embodiment, when ten modules are employed, ten voltage regulates are employed. Further, sign panel 10 has a single microcontroller 20 electrically coupled to the circuit of sign panel 10. Microcontroller 20 is located on the first module 12 on each panel 10, the first module 12 being located on a left short edge 22 of panel 10. The remaining modules 12 are identically configured except for the absence of a microcontroller and therefore are not repeated in structural FIGS. 2 and 3 and schematic diagram FIG. 4. Finally, referring to FIG. 2, a power bus 28 and a ground bus 30 are located along front side 11 of panel 10 perpendicular to the orientation of modules 12. Other electrical components are also employed on each sign panel 10, but will be discussed hereinafter with reference to FIG. 4—the schematic diagram.

Figure 4:
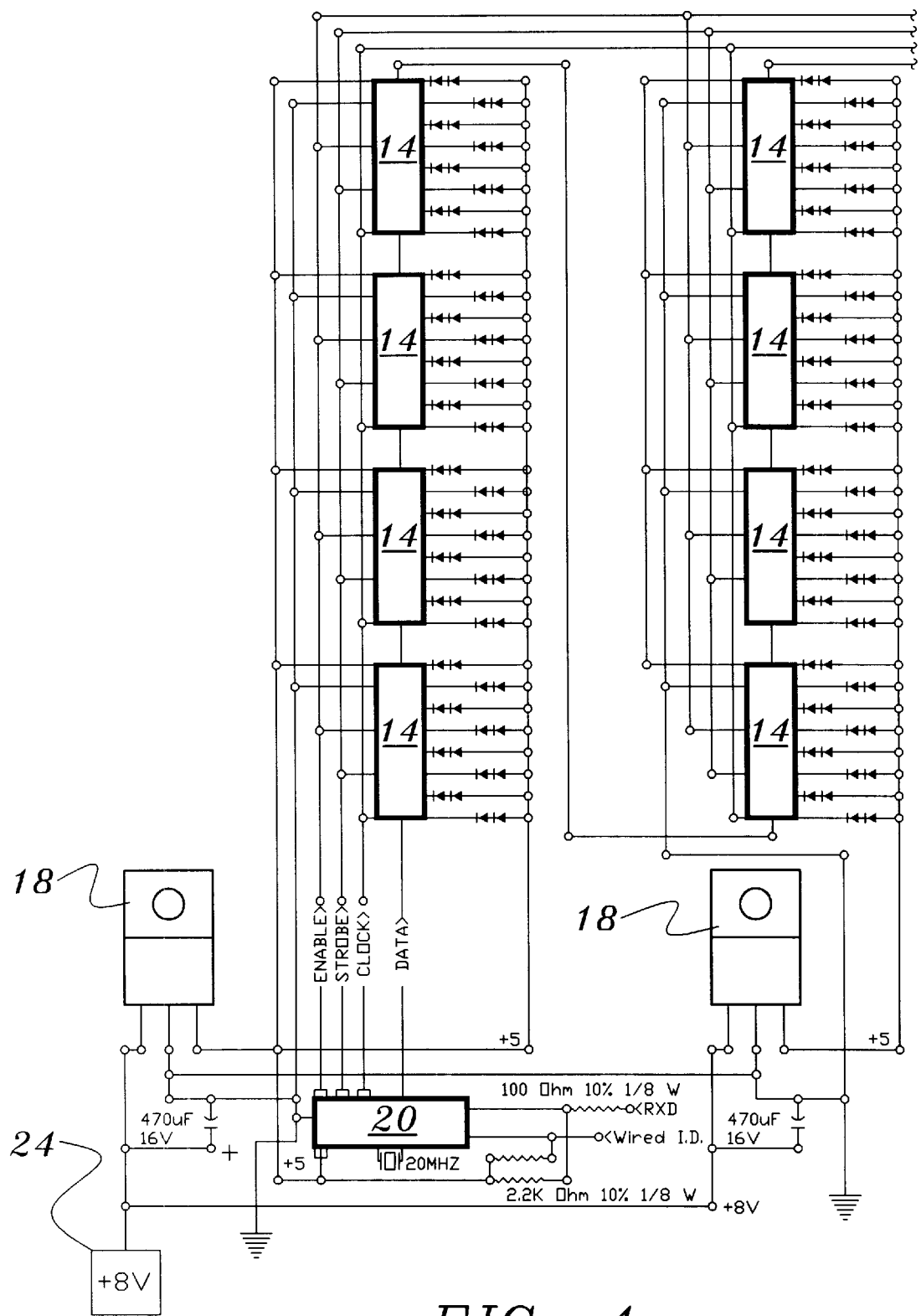
FIG. 4 is a schematic diagram of the electronic circuit employed in the present invention.

Referring to FIG. 4, a schematic diagram of the circuit employed on panel 10 is shown. The schematic diagram contains the circuitry of the first two modules of panel 10; the first module contains microcontroller 20. It is understood that the circuit would repeat, with reference to the circuitry represented by the second module of FIG. 4, equal to the remaining number of modules employed on a single sign panel.

As shown in FIG. 4, +8 v DC is supplied via a power supply 24 and is electrically coupled to the input terminal of each voltage regulator 18. In the preferred embodiment, plastic package LM7805 voltage regulators are employed which output a regulated +5 v DC to each module circuit and to the microcontroller 20. The ground terminal of each voltage regulator 18 is coupled to a common ground.

Figure 5:
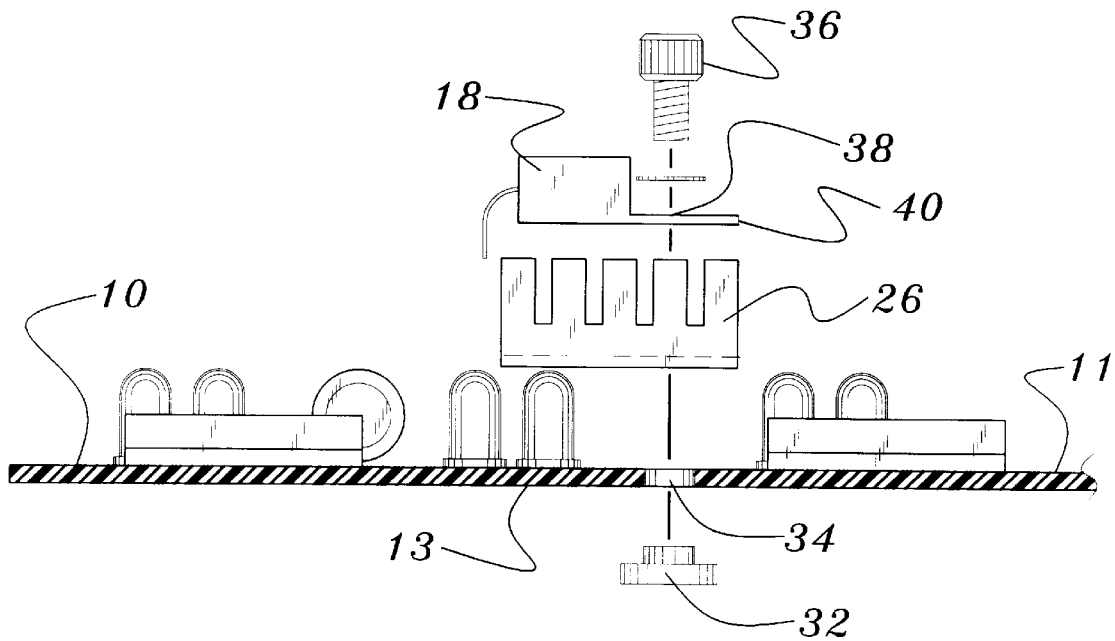
FIG. 5 is an exploded side elevational view, partially in section, taken along lines 5—5 of FIG. 1 of a voltage regulator employed in the present invention.

Referring to FIG. 5, each regulator 18 is housed within a heat sink 26 permitting load currents over 1.0A. Each regulator 18 is mounted to panel 10 by first pressing a nut 32 through a ground aperture 34 formed in panel 10 from bottom side 13 and soldering it thereto. Secondly, a screw 36 is inserted from top side 11 of panel 10 through a regulator aperture 38 formed in a tab portion 40 of regulator 18 engaging threads of nut 32. Each regulator 18 on each module 12 is located on panel 10 such that regulator aperture 38 is axially aligned with ground aperture 34 formed on each module 12 through ground bus 30. The coupling of each regulator 18 to ground bus 30 also provides additional heat dissipation along ground bus 30 in opposed directions from each regulator 18. In the preferred embodiment nut 32 is a 632KF PEM (Pennsylvania Engineering and Manufacturing) nut and screw 36 is a 6/32 socket head screw.

Referring to FIG. 4, a polarized capacitor on each module (ten are used in the preferred embodiment) is coupled along the +8 v power supply line at its positive plate; the opposed plate is coupled to the common ground. In the preferred embodiment 470 uf 16 v polarized capacitors are employed and work as filter capacitors to the power supply thereby smoothing out any voltage variations. Each LED sign panel, and therefore each sign panel circuit, contains a single microcontroller 20 located along the first module of sign panel 10. In the preferred embodiment, a PIC16C58A microcontroller, manufactured by Microchip Technology, is employed. The PIC16C58A is an EPROM/ROM-based 8-bit CMOS microcontroller operating at 20 MHZ and having 18 pins, 12 I/O ports (one 4-bit I/O port and one 8-bit I/O port) and 2K of EPROM/ROM.

Figure 6:
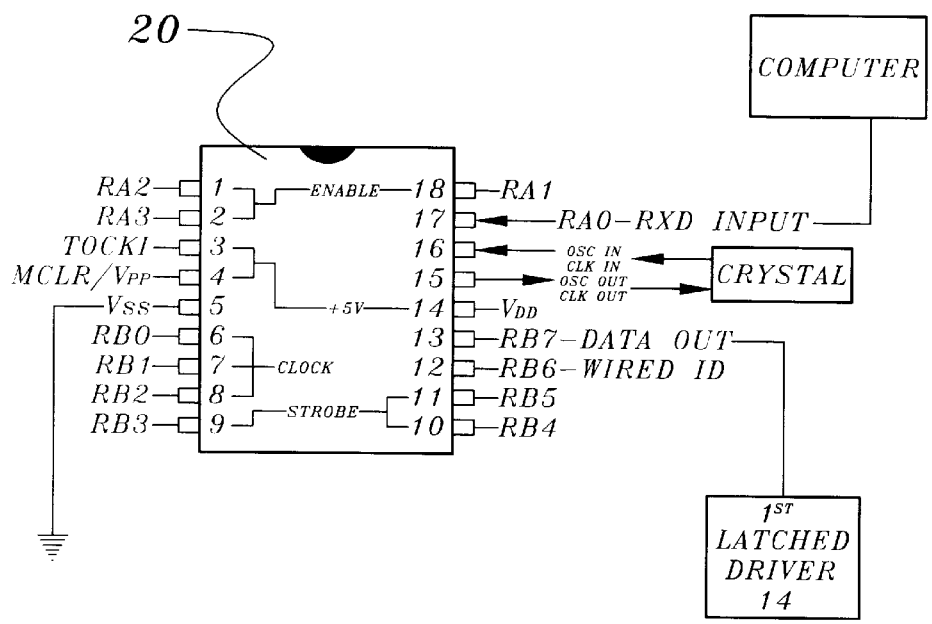
FIG. 6 is a diagram of the microcontroller used in the present invention depicting the configuration of the chip pins.

Referring to FIG. 6, the one 4-bit I/O port, designated herein as port A, is comprised of pins 1, 2, 17 and 18 and is coupled to the circuit in the following manner: bit 0 (RA0—pin 17) is the RXD input from a computer supplying a graphic or movie file; bits 1, 2 and 3 (RA1, RA2 and RA3—pins 18, 1 and 2, respectively) are tied together and represent enable out of microcontroller 20. The one 8-bit I/O port, designated herein as port B, is comprised of pins 6 through 13 and is coupled to the circuit in the following manner: bits 0, 1 and 2 (RB0, RB1 and RB2—pins 6, 7 and 8, respectively) are tied together and represent clock output of microcontroller 20; bits 3, 4 and 5 (RB3, RB4 and RB5—pins 9, 10 and 11, respectively) are tied together and represent strobe output of microcontroller 20; bit 6 (RB6—pin 12) is a WIRED ID (to be discussed in further detail hereinafter) of microcontroller 20); and bit 7 (RB7—pin 13) is serial data output to serial data input to the first latched driver (display chip). A crystal, a 20 MHZ clock, is coupled to microcontroller 20 at pins 16 and 15 (clock-in and clock-out respectively). Pin 5 ($V_{SS}$) of microcontroller 20 is coupled to ground. Pins 3, 4 and 14 (TOCKI, MCLR/$V_{PP}$ and $V_{DD}$, respectively) are tied together and coupled to the regulated +5 v DC.

With reference to FIG. 4, the RXD input, supplied from a computer has a resistor, coupled in series along RXD input, acting as a current limiter. In the preferred embodiment, a 100 ohm, ⅛ watt resistor is used having a 10% tolerance rating. The WIRED ID and the RXD input are both electrically coupled to the regulated +5 v DC. Intermediate a pair of points along the RXD input and WIRED ID and the regulated +5 v DC are a pair of pull-up resistors, one for each line. In the preferred embodiment, a pair of 2.2K ohm, ⅛ watt resistors are used having tolerance ratings of 10%.

Continuing with FIG. 4, a plurality of latched drivers ICs (display drivers) 14 are employed on each module. In the preferred embodiment, four 16 pin 5821 BiMOS II 8-bit serial-input latched drivers are employed on each module. Drivers 14 are comprised of an 8-bit CMOS shift register, CMOS control circuitry, eight CMOS data latches and eight bi-polar current-shifting Darlington output drivers. The pins of every latched driver 14 employed on a single sign panel 10 are configured in the following manner: pin 1 (clock in) receives the clock output from microcontroller 20 and is a positive edge trigger; pin 2 of the first latched driver (serial data in) receives the data output from microcontroller 20; pin 3 (logic ground) is tied to pin 8 (power ground) which are in turn coupled to the common ground; pin 4 ($V_{DD}$) is coupled to the regulated +5 v DC; pin 5 (serial data out) is coupled to serial data in (pin 2) of the next serial latched driver 14 on sign panel 10; pin 6 (strobe in) receives the strobe output from microcontroller 20; and pin 7 (output enable) receives the enable output from microcontroller 20. Pins 9–16 represent outputs 1–8 of latched driver 14 wherein pin 9 is output$_8$ and pin 16 is output$_1$. One pair of LEDs 16 are wired in series to each of the eight outputs of each latched driver 14 such that the cathode of the first LED of each pair is coupled to one of the eight outputs of the latched driver and the anode of the second LED in the pair is coupled to the regulated +5 v DC. Coupling the LEDs in this backwards manner, provides greater current capabilities. Four LEDs (two pair of LEDs or a pair of latched driver outputs) represent a single pixel of light. Accordingly, in the preferred embodiment, wherein 16 LEDs are coupled to each latched driver, four pixels of light are controlled by each latched driver. Also to the preferred embodiment, when a cluster of four LEDs is employed to represent a single pixel of light, two red LEDs and two green LEDs are employed in a cris-cross pattern permitting a multitude of different colors to be displayed. In an alternate embodiment, four one color LEDs are employed per pixel of light.

Figure 7:
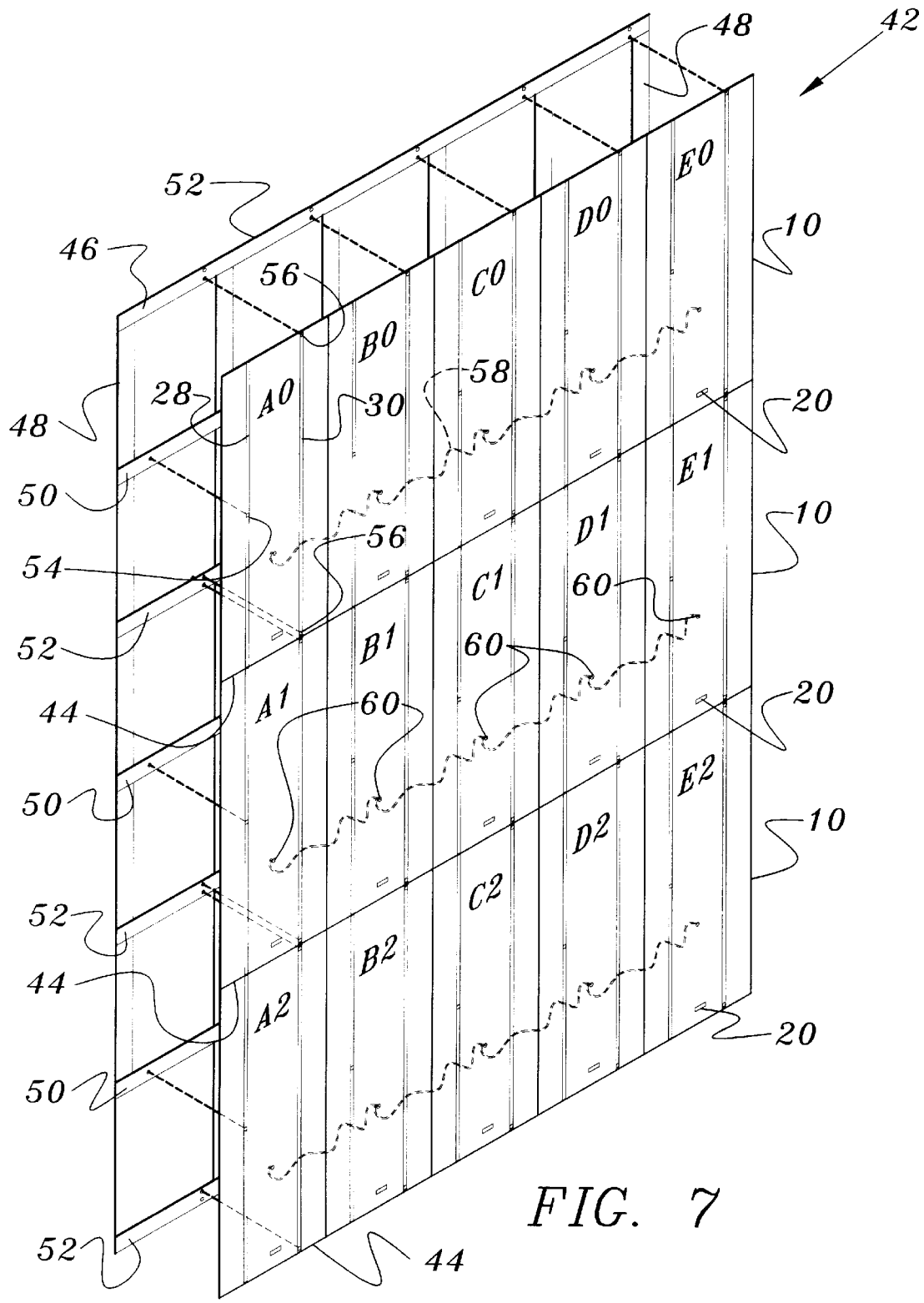
FIG. 7 is a front plan view of an LED panel display system, of the present invention, configured to utilize multiple LED sign panels.

Referring to FIG. 7, an LED sign panel display system 42 is shown wherein fifteen individual sign panels 10 are employed to create panel display system 42. It is understood that no limit exists on the number of panels 10 that could be employed to create a single panel display system. In FIG. 7, fifteen panels are used strictly for illustrative purposes only. Panels 10 are arranged in a row-column array such that display system 42 is a 3×5 panel array. Panels 10 are positioned vertically such that microcontroller 20 is located near a bottom portion 44 of each panel 10, although alternate positioning of panels 10 can be employed. Panels 10 are rigidly mounted on a frame structure 46. Frame structure 46 has non-conducting rail portions 48, power conducting rail portions 50 and ground rail portions 52. Power conducting rail portions 50 are insulated to avoid a shoot circuit due to any incidental contact with ground rail portions 52. A power bus plate-through mounting hole 54 (see FIG. 1) formed in power bus 28 of each panel 10 permits a screw to insert therethrough and mount panel 10 at a first position to frame structure 46 along one of the power conducting rails 50 coupling panel 10 to the unregulated power supply. A pair of ground bus plate-through mounting holes 56 formed in ground bus 30 of each panel 10 at opposing ends of ground bus 30 permit screws to be inserted therethrough and mount panel 10 at second and third positions to frame structure 46 along one of the ground rails 52 coupling panel 10 to common ground. A single jumper wire 58 is connected between each microcontroller 20 on each panel 10 by coupling wire 58 to a screw inserted within a microcontroller plate-through aperture 60 (see FIG. 1) formed in each panel 10 which is electrically coupled to the RXD line from the computer. Power is supplied to system 42 via the power supply (not shown in FIG. 7). The computer (also not shown in FIG. 7) is coupled to system 42 via an RS-232 connection.

Once panel display system 42 is mounted and connected, as explained hereinabove, an operator is ready to display a graphic or movie file. It is understood that a graphic file represents a single frame display while a movie file represents a series or sequence of frames of at least two frames. The operator, utilizing computer software (i.e. desktop PC DOS based or Windows based software), first defines the panel array. For example, referring to FIG. 7, a 3×5 panel array is shown. Secondly, the operator assigns. a LOGICAL ID to each panel and associates that LOGICAL ID with a logical position in panel display system 42. Given that each microcontroller 20 already has a unique four byte ROM ID "burned" therein (to be discussed in further detail hereinafter), the operator merely equates the ROM ID with a LOGICAL ID using an ASSIGN command in which the microcontroller understands. Thereafter, the operator tells the software that a particular LOGICAL ID is located in a specific logical position. Referring to FIG. 7, it is shown that the top left panel is logical position A0, the panel directly below A0 is A1. The panel directly to the right of A0 is B0. This pattern is repeated until each panel is assigned its LOGICAL ID and logical position. Even though the logical position is a two character string, it still permits the use of logical positions in excess of 10 rows (i.e., eleven rows would utilize A0–A9 and then AA for the eleventh row) and 26 columns (i.e., 27 columns would utilize A0–Z0 and then Aa for the twenty seventh column). Logical position A0 is actually equal to LOGICAL ID 00A0, and logical position AA is equal to LOGICAL ID 00AA (when four characters are not needed for a logical position, character zeros are placed in front of the two character string to create the LOGICAL ID). The four character assignment for ROM and LOGICAL ID and the two character assignment for the logical position is not limited to numbers and letters. The total number of combinations equals approximately $256^4$, due to the use of lower and upper case letters, the numbers 0–9, and various punctuation.

The novel approach of defining display panel system 42 through the use of LOGICAL ID provides many benefits. First, if a panel fails and needs replacement the graphic or movie file does not need to be edited. The operator merely replaces the failing panel and instructs the software that the replacement panel, having a unique ROM ID, now has the same LOGICAL ID of the panel that failed and is located in that same logical position. This eliminates any need to modify the graphic or movie file, since the file will display on system 42 based on LOGICAL ID and logical position, not ROM ID. Secondly, if a two or four-faced system is employed, for example, whereby the same graphic or movie will run on all faces of the system simultaneously, LOGICAL ID and logical position facilitate the running of the file. In the two-faced panel system example, the software would associate two unique ROM ID numbers, each located on different faces of the two-faced system, with the same logical positions—for example A0 being the top left panel of each face. This allows the graphic or movie to run on both faces identically and simultaneously. Thirdly, graphics or movies can be created using LOGICAL ID numbers and logical positions. This permits different systems to run the same graphic or movie even though the systems are configured with different unique ROM ID assigned panels.

If desired, the WIRED ID of microcontroller 20 can be used to assign a unique serial number to each panel thereby substituting WIRED ID for the burned-in ROM ID, although ROM ID still exists and can be accessed if desired. The most desirable reasons for utilizing WIRED ID relate to the operation of a system in which a desktop PC will not be used or for very small panel display systems. When not using the PC (the host), there is no need to maintain an index table of ROM ID numbers. Use of WIRED ID permits easy replacement of panels in simple systems (systems with only a few panels). To utilize WIRED ID to assign unique serial numbers to panels of a multi-panel system, the WIRED ID lead of the first microcontroller is coupled to output, of the first latched driver on the first panel, the WIRED ID of the second microcontroller is coupled to output$_2$ on the first latched driver on the second panel, the WIRED ID of the third microcontroller is coupled to output$_3$ of the first latched driver on the third panel and so on up to 255 panels. When more than eight panels are employed in the system, the next latched driver in series is used. Accordingly, since only 255 unique serial numbers can be assigned using WIRED ID, only the first thirty-two latched drivers can be used. In other words, in a system of 255 panels, the last panel would be assigned the unique serial number of 255 by coupling the WIRED ID of the microcontroller on panel number 255 with output$_7$ on the thirty-second latched driver on panel number 255. To assign serial numbers, an upwardly incrementing counter is used. The first panel to be assigned is assigned number 1. To initiate the counter, an entire set of ones is clocked into the latched drivers of all panels in the system. The strobe outputs of the microcontrollers are held high during the WIRED ID routine so that all shifted data is latched immediately to the outputs thereby making the data continuously available on the latched driver outputs. Shifting an entire set of ones into the latched drivers clears the entire display (actually, an entire set of zeros is clocked into the shift registers of the latched drivers, but because the latched drivers invert the value prior to latching it out, ones appear at that latched driver outputs). Secondly, a single zero is shifted into the first latched driver on each panel (again, in actuality, a one is clocked into the shift registers of the latched drivers, but a zero is latched out due to the inversion within the latched driver prior to outputting the value to the latched driver output). This causes the WIRED ID line on the microcontroller to go low and is counted by the microcontroller as 1. Next, a one is shifted thereby moving the zero into the next register of the first latched driver. The panel having the WIRED ID coupled to output$_2$ of the first latched driver reads the zero, goes low, and counts that panel as number 2. The routine of shifting additional ones is repeated, up to 255 times until all panels are assigned a value of 1–255.

In the preferred embodiment, system 42 or even a single panel 10 are run by utilizing desktop PC DOS or Windows based software. For example, in a DOS based system, the software program Signplay can be utilized, although other proprietary DOS based programs can be written to run system 42 or panel 10. Further, in a Windows based system, the program Framemaker can be used, although again, other proprietary written Windows based (Visual Basic written) software can be utilized. If a DOS based PC is used, a computer having a 286 processor or higher can run system 42 or panel 10, thereby requiring a very inexpensive investment in the computer. Since DOS based 286, 386 and 486 computers have very few applications in today's market due to other more desirable high speed processors, the use of such is not only economical but an efficient use of outdated and unwanted technology.

Microcontroller 20 receives data via its RXD input from the TX line of an RS-232/TTL (0 to +5 v) serial port, 4800 baud or greater. Data is transmitted to the panels in packets of six or more bytes. The data is RS-232/TTL, serial, 1-start bit, 8-data bits, 1-stop bit, no parity, LSB (least significant bit) first.

Microcontroller 20 has firmware (the program) "burned" therein which permits microcontroller 20 to carry out its functions. When power is first applied to system 42 or panel 10 the program begins at START, wherein the ports and system are initialized and the display is cleared. Bit 0 of port A on microcontroller 20 (the RXD input line) is checked. If RXD is low, 0V DC, the program jumps to HOST and waits to receive data. If RXD is high, >+2 v DC, the program jumps to TEST, wherein alternate LEDs are flashed. TEST allows system 42 or panel 10 to be easily checked for proper operation. If anytime during TEST, RXD goes low, then the program jumps back to START.

Microcontroller 20 receives seven types of commands: LOAD Frame (single-clocked), LOAD Frame (double-clocked), LOAD AND SHOW Frame (single-clocked), LOAD AND SHOW Frame(double-clocked), SET BRIGHTNESS, SHOW ID and ASSIGN ID. SET BRIGHTNESS, SHOW ID and ASSIGN ID are considered "NON-LOAD" commands while LOAD Frame (single and double-clocked) and LOAD AND SHOW Frame (single and double-clocked) are considered "LOAD" commands. No display bytes are loaded in the latched drivers with the NON-LOAD commands. Since each of the seven commands can be implemented utilizing any of the three potential ID numbers: ROM ID, WIRED ID or LOGICAL ID, there are twenty-one valid commands for microcontroller 20.

To determine what and how much data is being sent and whether that data is intended for a particular microcontroller, each microcontroller looks at the first incoming packet of data, or "header packet." The header packet is at least six bytes long. The first byte of the header packet is the COMMAND byte (see FIG. 8), which is actually the command and timing byte combined; this byte must have its LSB=low. Since data is sent LSB first, making the LSB=low allows the start bit to be isolated, timed, and used as the baud rate value. Since RS-232 data is inverted, the LSB is actually encoded as a 1, but represents low or 0 v DC (the start bit is always high (+3 v DC) per RS-232 specifications). Therefore, bit 0 of the COMMAND byte must be 1. It is noted that the COMMAND byte actually has an additional two bits attached at either end of the one byte data string— namely, the start bit and the stop bit, as shown in FIG. 8.

Figure 8:
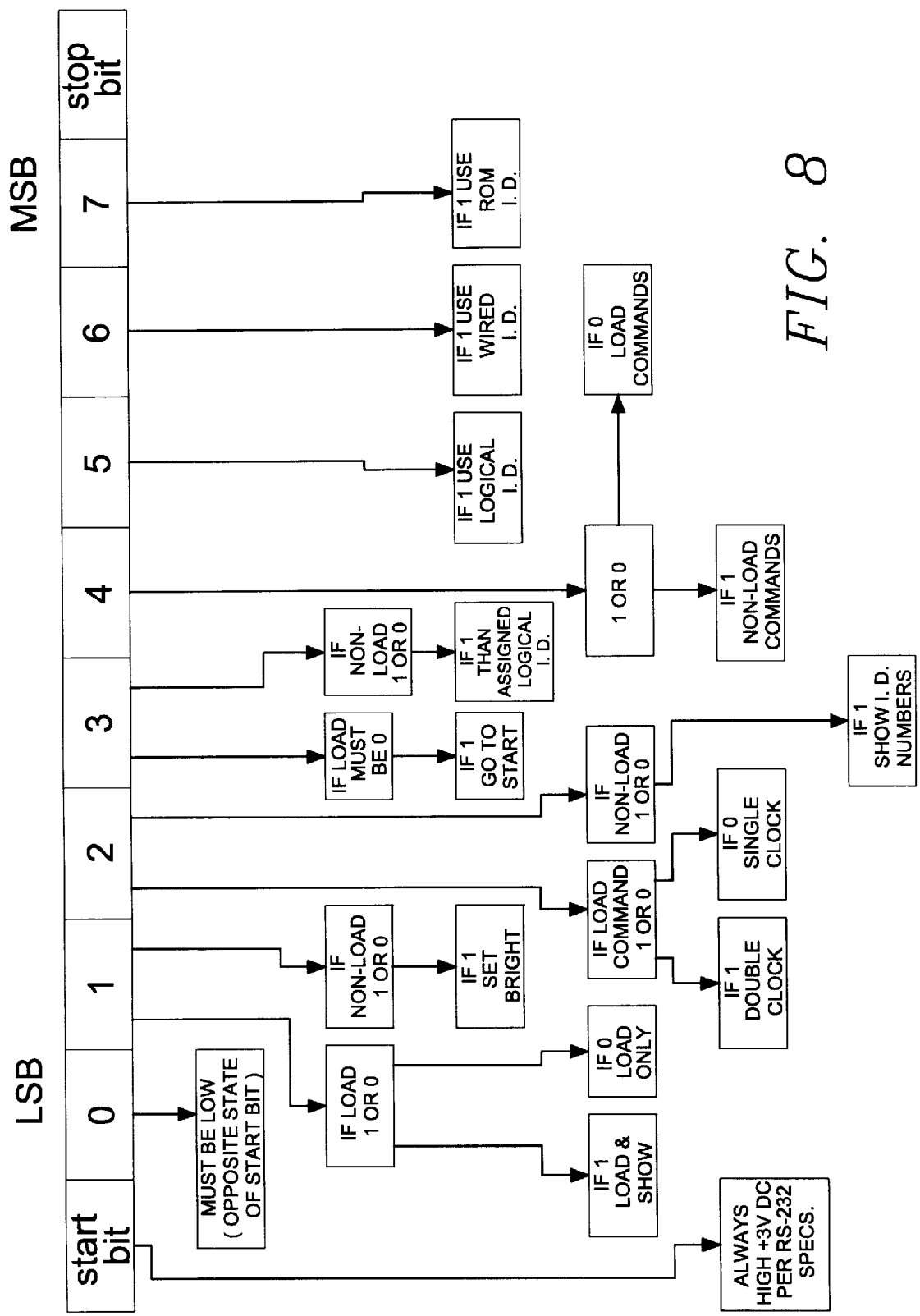
FIG. 8 is a logic diagram depicting how the microcontroller reads the command byte of a header packet of data.

Referring to FIG. 8, the microcontroller must first determine which ID it will use (ROM, WIRED OR LOGICAL) to carry out its incoming command. The determination is made by looking at bits 7, 6 and 5 (MSB first) wherein if bit 7 is 1, then the four byte ROM ID is used, if bit 6 is 1, then the four byte WIRED ID is used or if bit 5 is 1, then the four byte LOGICAL ID is used. It is understood that the WIRED ID is a four byte string of data, although three of the four bytes are ignored ("no-ops"); for example, if the WIRED ID was going to be the number 135, the four byte string would look like 00000000 00000000 00000000 10000111. Next, the microcontroller determines whether the incoming command is a LOAD or a NON-LOAD command. If bit 4 of the COMMAND byte is 1, then NON-LOAD commands are selected. If bit 4 of the COMMAND byte is 0, then LOAD commands are selected.

Assuming bit 4 of the COMMAND byte was 1, and therefore a NON-LOAD command, the microcontroller determines which of the three NON-LOAD commands has been sent. In the NON-LOAD scenario, if bit 3 of the COMMAND byte is 1, the data is ASSIGN LOGICAL ID which assigns a logical position to the panels. Accordingly, there are four more bytes attached to the header packet making this a ten byte packet of data (four extra bytes for the four byte LOGICAL ID number). The LENGTH byte (to be discussed in further detail hereinafter) is set to four for host (the computer) playback readability. The microcontroller counts out these extra four bytes but essentially ignores them. The four extra bytes are obtained from the RXD line, then saved by the panel to which it is matched. The assign LOGICAL ID command is reset at the beginning of each movie sequence.

Continuing with the NON-LOAD scenario, if bit 2 of the COMMAND byte is 1, the data is SHOW ID numbers whereby the panels will display their ID numbers as binary encoded numbers on the first three chip rows (modules). The top chip of each row is the first byte of each ID number. The first far left module, that which is proximal to left edge 22 of panel 10 (see FIG. 1), displays the four byte ROM ID. The next row to the right of the first far left module displays the four byte WIRED ID, if one is assigned (note, that since the no-op bytes are ignored, the top three chips will be off) and the next row to the right displays the four byte LOGICAL ID. The LENGTH byte is discarded (not used—value is irrelevant) although the total number of bytes sent in this header packet remains at six.

Still, continuing with the NON-LOAD scenario, if bit 1 of the COMMAND byte is 1, the data is SET BRIGHTNESS whereby the brightness of the panel is set to a value between 0 and 225 contained within the LENGTH byte. Value0=off, value1=dimmest setting and value255=brightest setting. The total number of bytes sent in this header packet is six. If no brightness level is set prior to display of a frame, the level is set to a default value=1. The brightness level is reset at the beginning of each movie sequence.

None of the NON-LOAD commands contain a string of display bytes attached to the end of the NON-LOAD command header packets. Such is reserved for the LOAD commands. Assuming bit 4 of the COMMAND byte is 0, and therefore a LOAD command, the microcontroller determines which of the four LOAD commands has been sent. First, bit 3 of the COMMAND must be 0 when LOAD commands are selected, otherwise the program jumps to START.

If bit 2 of the COMMAND byte is 0, then data is single-clocked into the display. If bit 2 of the COMMAND byte is 1, then data is double-clocked into the display. Double-clocked is defined as two bits being clocked into the chips (latched drivers) for every one bit received. This permits faster and shorter packets to be clocked out to the latched drivers if a single color display is employed (i.e., instead of forty-six bytes of data only twenty-six bytes are clocked—a forty-six byte packet representing a six byte header packet and forty bytes of display data for forty latched drivers on a single panel—in this double-clocked example, only twenty bytes of display data would need to be clocked for the forty latched drivers). If two color displays are employed, then single-clocked commands are used. Single-clocked is defined as one bit being clocked into the latched drivers for every one bit received. One LED color displays (i.e., red LEDs) can render one color on the display whereas two color displays (i.e. red and green LEDs) can render a multitude of colors. Still further, three color displays (i.e., red, green and blue LEDs) can render even a wider selection of the color spectrum.

Continuing with the LOAD command scenario, if bit 1 of the COMMAND byte is 1, data is LOAD AND SHOW when the frame is complete within that panel (panel has received the number of bytes specified in the LENGTH byte). This command permits various "wipe-on" patterns to be executed by alternating the sending order of the packets of data. Since LOAD and SHOW displays data on the particular panel as soon as the latched drivers have received their data, manipulating the order of the data load provides a "firing order" mean, for displaying data on a system at discrete and separate time intervals.

Still continuing with the LOAD command scenario, if bit 1 of the COMMAND byte is 0, then data is LOAD only but not shown. Data will be shown upon the microcontroller receiving a separate show command. This can be accomplished by sending a six byte packet (similar to the header packet) with a LOAD and SHOW command in the COMMAND byte, a zero in the LENGTH byte and ** in the ID code byte, which "flashes" the entire display system at one time. The microcontroller reads ** in the ID byte as a match to every panel in the display system (a wildcard match). Finally, since the LENGTH byte is set to zero, the microcontroller would not look for any data past the header packet and return to HOST. When any of the seven LOAD or NON-LOAD commands are complete, the program jumps back to HOST and waits for the next packet of data to be sent to the microcontrollers.

The second byte of the header packet is the LENGTH byte. It represents the number of bytes in the packet beyond the six byte header packet. For instance, in a double-clocked LOAD command, the value in LENGTH would be twenty; in a single-clocked LOAD command, the value in LENGTH would be forty. It is understood that the one byte LENGTH values are dependent on the size of the panel used. The examples of twenty and forty above are for the preferred embodiment. If a panel had sixty latched drivers coupled thereupon, then the double-clocked and single-clocked command LENGTH byte values would be thirty and sixty, respectively. Since the LENGTH byte is only one byte, a maximum of 255 latched drivers could be used on a single panel 10.

If the SET BRIGHTNESS command is sent, then the value in LENGTH is some decimal number between 0 and 255. Accordingly 256 different brightness levels can be assigned to the LEDs. To set the brightness of the LEDs, microcontroller 20 utilizes the enable line of microcontroller 20 which is coupled to every output enable pin on every latched driver on its panel. A rotating routine, which runs continuously during display of data, shifts the brightness value through the output enable of each latched driver and sets the LED brightness. Enable is active low when carrying out its function. The routine looks at the binary number and continuously turns the LED on and off depending on which logic value it reads. It turns the LED off when it reads a zero and turns it on when it reads a one. Accordingly, if the decimal number 170 (binary number 10101010) is inputted, the LED would be on one half of the time. This represents 50% brightness. But, it is noted that decimal number 85 (binary number 01010101) accomplishes approximately the same cycle—the LEDs are on 50% of the time. By calculation, it is noted that although there are 256 different binary numbers which could be rotated through the enable line in the LENGTH byte, there are only eight combinations of numbers which can contain one to eight is in the one byte binary number (i.e., one 1, two 1s, three 1s, four 1s, five 1s, six 1s, seven 1s or eight 1s). Accordingly, there are eight overall brightness levels in which the LEDs can be set. But, it is noted, that the placement of the 1s does affect the brightness depending how often the LEDs are on. For instance, there is a slight variation in the brightness value when rotating the binary number 10101010 versus 00001111, even though mathematically, the LEDs are on 50% of the time with each of these two binary numbers. Accordingly, the brightness of the LEDs has 256 values in which it can be set.

The third and final portion of the header packet is the four byte ID code for a particular panel. The ID bytes sent must match those of a panel for the command, embedded in the COMMAND byte, to act. Depending on which type of ID is being used, the ID must match one of the three potential IDs (ROM ID, WIRED ID or LOGICAL ID). If any of the ID bytes are an *, then all panels accept the byte as a match.

The microcontroller receives all the data coming from the RXD line of the computer, but only some of that data is addressed to each particular panel. If the data is valid but not intended for the particular panel, the microcontroller ignores the data. If the data is erroneous, the microcontroller resets by jumping back to START. If the data is valid and it matches, then the microcontroller acts upon the data in the following manner. This assumes that the header packet was examined and the microcontroller found a match of ID. Upon comparing the header packet ID with its own ID, if it is a match (its true), it sets a match bit. The next byte of data is received wherein if the match bit is true, it shifts the data out to the first latched driver and subtracts one from the LENGTH byte. If this new value is not zero, the microcontroller jumps back and gets another byte of data. The routine is repeated until the substraction from the LENGTH byte renders a value of zero. This indicates that the panel has received the total number of bytes of data specified in the LENGTH byte. This ensures that all the latched drivers will be filled with the serial data received by the microcontroller. When the data is to be shown, the strobe line will momentarily pulse (go high) which latches all the data to the outputs of the latched drivers and displays the graphic on the LED panel.

In the preferred embodiment, the pixels of light (four LEDs) are positioned on panel 10 at 1" dot spacing. Utilizing a preferred panel of ten modules, forty Latched drivers and six hundred and forty LEDs, forms a panel size of 20" by 8". In an alternate embodiment, 1½ dot spacing is employed. Utilizing the above preferred number of components forms a panel size of 30" by 12".

Other alternate embodiments exist which utilize different configurations of LEDs. For example, two pair of seven LEDs can be coupled to each eight outputs of a single latched driver. In this embodiment, three colors can be employed whereby each group of seven LEDs represents a pixel of light. The group of seven LEDs are generally arranged in a circular pattern such that one pair of LEDs are positioned above a set of three LEDs which are in turn positioned over another pair of LEDs. In such configuration, the bottom pair of LEDs are green and are coupled in series to $output_1$ of the latched driver. The top pair of LEDs are also green and are coupled in series to $output_2$. The two outer LEDs of the set or three are red LEDs and are coupled in series to $output_3$. The center LED of the set of three is a single blue LED and is coupled to $output_4$. This coupling pattern would be repeated for the second group of seven LEDs for $outputs_{5-8}$, respectively, of the latched driver. It is noted that the blue LED is coupled to a single output of the latched driver due to higher voltage requirements to run the LED (utilizes entire regulated +5 v DC). The seven group pattern can also be configured with various latched driver configurations. For instance, eighty latched drivers can be employed (eight per module—2 rows of four) thereby providing a panel with 1120 LEDs (112 LEDs per module× 10 modules). If such configuration is employed, each module requires additional capacitors and regulators—more particularly, twenty voltage regulators (two per module) twenty capacitors (two per module).

Equivalent electrical components, integrated circuits and logical functions can be substituted for the ones set forth above to achieve the same results in the same manner.

Having thus described the invention what is claimed and desired to be secured by Letters Patent is:

1. A modular messaging sign panel capable of emitting light, the panel comprising:

a) an electrical circuit board;
   b) a plurality of lights coupled to the circuit board;
   c) a plurality of display chips coupled to the electrical circuit for driving the lights;
   d) a three wire connection to the panel, a first wire connected between a host and the electrical circuit on the panel, and second and third wire connections between a power supply and the electrical circuit on the panel; and e) uniquely addressable serial data selection and distribution means for receiving all serial data outputted from the host and distributing selected serial data to the display chips along a single serial data line if the selected serial data contains an address match for the panel, the uniquely addressable serial data selection and distribution means coupled to the electrical circuit.

2. The modular messaging sign panel of claim 1, wherein the plurality of lights are LEDs.

3. The modular messaging sign panel of claim 1, wherein the plurality of display chips are serial-in-parallel-out latched drivers.

4. The modular messaging sign panel of claim 3, wherein the plurality of latched drivers are coupled in series such that a first latched driver receives the serial data from the uniquely addressable serial data selection and distribution means at a serial data input and outputs the serial data to the next latched driver in series, the distribution of serial data terminating upon a condition in which each of the plurality of latched drivers on the panel receives 8-bits of serial data.

5. The modular messaging sign panel of claim 1, wherein the first wire of the three wire connection is made between the host and the panel by an asynchronous serial byte-orientated protocol coneciton and the second and third wire connections made between the power supply and the panel by a positive DC voltage and a common ground, respectively.

6. The modular messaging sign panel of claim 5, wherein the positive DC voltage is regulated upon the panel.

7. The modular messaging sign panel of claim 1, wherein the uniquely addressable serial data selection and distribution means is a microcontroller.

8. The modular messaging sign panel of claim 7, wherein the microcontroller contains a unique non-erasable serial number in memory permitting the microcontroller to distribute the selected serial data to the display chips for display on the panel by the lights.

9. The modular messaging sign panel of claim 7, wherein the selected serial data represents a single image frame which is distributed to registers in the display chips by the microcontroller while previously selected serial data previously distributed by the microcontroller representing a different single image frame is directed to a set of outputs of the display chips and displayed by the lights.

10. The modular messaging sign panel of claim 1, wherein a one color display is employed.

11. The modular messaging sign panel of claim 10, wherein two bytes of display data are distributed to the display chips for every one byte of serial data selected by the uniquely addressable serial data selection and distribution means.

12. The modular messaging sign panel of claim 1, wherein the uniquely addressable serial data selection and distribution means can receive and process a plurality of commands generated by the host, the plurality of commands comprising image load and non-load commands.

13. The modular messaging sign panel of claim 12, wherein a first non-load command sets the brightness value of the lights employed on the panel, the set brightness non-load command comprising of a six byte packet of data, a first portion containing a single byte command to notify the uniquely addressable serial data selection and distribution means that the incoming command is the set brightness command, a second portion containing a single byte length value corresponding to a light illumination value between 0 and 255, and a third portion containing a four byte serial number corresponding to a unique address of the panel, the light illumination value represented by an eight-bit binary number which is continuously rotated through an output enable pin on each of the plurality of display chips on the panel during an image display, the lights pulsating on and off in response to two opposed states contained within the binary number, the light illumination value of 1 being the dimmest setting and the light illumination value of 255 being the brightest setting.

14. A light emitting sign display system comprising:

a) at least two modular panels having electrical circuits traced thereupon;

b) a plurality of lights coupled to the electrical circuits of the modular panels;

c) a plurality of display chips coupled to the electrical circuits of the modular panels, the plurality of lights directly coupled to outputs of the display chips, the display chips capable of outputting data to the lights for the display of an image upon the sign display system;

d) a frame structure having voltage conducting rails and ground rails, the voltage conducting rails electrically coupled to a positive DC voltage of a power supply, the ground rails coupled to a common ground reference, the modular panels attached to the frame structure such that each modular panel is coupled to the DC voltage and the common ground reference; and e) uniquely addressable serial data and panel selection and distribution means for receiving all serial data outputted from a host and distributing selected serial data to the display chips of a particular panel within the sign display system along a single serial data line if the selected serial data contains an address match for the particular panel, the uniquely addressable serial data and panel selection and distribution means coupled to each electrical circuit on each panel.

15. The light emitting sign display system of claim 14, wherein the plurality of lights are LEDs.

16. The light emitting sign display system of claim 14, wherein the plurality of display chips are serial-in-parallel-out latched drivers.

17. The light emitting sign display system of claim 16, wherein the latched drivers are capable of directing selected serial data to the lights directly coupled to the outputs of the latched drivers while simultaneously receiving and storing different selected serial data within registers of the latched drivers for future directing to the outputs.

18. The light emitting sign display system of claim 14, wherein each modular panel of the system has a power and ground bus, the power bus on each panel having a plate-through hole for receiving a screw and coupling each panel to the voltage conducting rail of the frame structure, the ground bus on each panel having at least one plate-through hole for receiving a screw and coupling each panel to the ground rail of the frame structure.

19. The light emitting sign display system of claim 18, wherein the positive DC voltage on each panel is regulated.

20. The light emitting sign display system of claim 14, wherein the uniquely addressable serial data and panel selection and distribution means is a plurality of microcontrollers, each microcontroller individually associated with one of the plurality of modular panels such that the number of microcontrollers employed is directly proportional to the number of modular panels employed within the system, the plurality of microcontrollers within the sign display system wired in parallel with respect to the serial data output from the host.

21. The light emitting sign display system of claim 20, wherein a single data jumper wire is coupled between each of the plurality of modular panels within the sign display system.

22. The light emitting sign display system of claim 20, wherein each of the plurality of microcontrollers contains a first unique non-erasable serial number in memory permitting each microcontroller to be individually addressed for distributing the selected serial data to the display chips for display by the lights.

23. The light emitting sign display system of claim 22, wherein a second and separate unique serial number is assignable to each microcontroller for use in directing selected serial data to a particular modular panel within a sign display system employing a maximum of 255 modular panels, the second and separate unique serial number assigned to each microcontroller by coupling a WIRED ID lead of a first microcontroller to a first output of a first display chip on a first modular panel, a WIRED ID lead of a second microcontroller to a second output of a first display chip on a second modular panel and a WIRED ID of a n microcontroller to an x output of a y display chip on an n modular panel, wherein n represents the total number of modular panels and microcontrollers, equal to 255 or less, employed within the display system, y represents a display chip on the n modular panel and is determined by dividing the total number of modular panels to be used by the number eight and rounding that number up to the next whole number if that number equals a value that exceeds a whole number, and x represents some number between 1 and 8 and is determined by multiplying a fractional portion of the number calculated in the chip determination by the number eight, and if the fractional number is zero, the eighth output is used.

24. The light emitting sign display system of claim 20, wherein the microcontrollers can receive and process a plurality of commands generated by the host, the plurality of commands comprising image load and non-load commands.

25. The light emitting sign display system of claim 24, wherein a first non-load command sets the brightness value of the lights employed on all of the modular panels, the set brightness non-load command comprising of a six byte packet of data, a first portion containing a single byte command to notify the plurality of microcontrollers that the incoming command is the set brightness command, a second portion containing a single byte length value corresponding to a light illumination value between 0 and 255, and a third portion containing a four byte serial number corresponding to a unique address of the panel, the light illumination value represented by an eight-bit binary number which is continuously rotated through an output enable pin on each of the plurality of display chips on the panel during an image display, the lights pulsating on and off in response to two opposed states contained within the binary number, the light illumination value of 1 being the dimmest setting and the light illumination value of 255 being the brightest setting.

26. The light emitting sign display system of claim 24, wherein a second non-load command assigns a unique logical position to each modular panel of the system with respect to a grid representing the sign display system, the second non-load command associating the unique logical position for each panel with the first unique non-erasable serial number for each microcontroller.

27. The light emitting sign display system of claim 14, wherein a one color display is employed.

28. The light emitting sign display system of claim 27, wherein two bytes of display data are distributed to the display chips for every one byte of serial data selected by the uniquely addressable serial data and panel selection and distribution means.

29. An LED sign display system comprising:
   a) at least two modular panels having electrical circuits traced thereupon;
   b) a plurality of LEDs coupled to the electrical circuits of the modular panels;
   c) a plurality of latched drivers coupled to the electrical circuits of the modular panels, the plurality of LEDs directly coupled to outputs of the latched drivers, the latched drivers capable of outputting data to the LEDs for the display of an image upon the sign display system, the latched drivers on a single panel coupled in series along a single serial data line on each panel;
   d) a frame structure having voltage conducting rails and ground rails, the voltage conducting rails electrically coupled to a positive DC voltage of a power supply, the ground rails coupled to a common ground reference, the modular panels attached to the frame structure such that each modular panel is coupled to the DC voltage and the common ground reference; and
   e) a plurality of microcontrollers each having a unique non-erasable serial number, the microcontrollers for receiving all serial data outputted from a host and distributing selected serial data to the latched drivers of a particular panel within the sign display system along the single serial data line if the selected serial data contains an address match for the particular panel, each microcontroller coupled to the electrical circuit of each panel.

\* \* \* \* \*